United States Patent
Huang et al.

(10) Patent No.: US 11,016,214 B2
(45) Date of Patent: May 25, 2021

(54) DOLOMITE RESERVOIR PREDICTION METHOD AND SYSTEM BASED ON WELL AND SEISMIC COMBINATION, AND STORAGE MEDIUM

(71) Applicant: YANGTZE UNIVERSITY, Wuhan (CN)

(72) Inventors: Junping Huang, Wuhan (CN); Yaohui Xu, Wuhan (CN); Yan Liu, Wuhan (CN); Zhigang Wen, Wuhan (CN); Wenxiang He, Wuhan (CN)

(73) Assignee: YANGTZE UNIVERSITY, Wuhan (CN)

( * ) Notice: Subject to any disclaimer, the term of this patent is extended or adjusted under 35 U.S.C. 154(b) by 0 days.

(21) Appl. No.: 16/925,507

(22) Filed: Jul. 10, 2020

(65) Prior Publication Data

US 2021/0026031 A1    Jan. 28, 2021

(30) Foreign Application Priority Data

Jul. 26, 2019    (CN) .......................... 201910680744.5

(51) Int. Cl.
*G01V 1/50*    (2006.01)
*G06N 20/00*    (2019.01)
(Continued)

(52) U.S. Cl.
CPC ................ *G01V 1/50* (2013.01); *E21B 47/14* (2013.01); *G01V 1/362* (2013.01); *G06F 30/27* (2020.01);
(Continued)

(58) Field of Classification Search
CPC .... G01V 1/50; G01V 1/362; G01V 2210/514; G01V 11/00; G01V 1/282; G01V 1/306;
(Continued)

(56) References Cited

U.S. PATENT DOCUMENTS

2004/0040711 A1    3/2004    Tomlinson
2015/0260034 A1    9/2015    Herron et al.

FOREIGN PATENT DOCUMENTS

CN    103527184 A    *    1/2014
CN    103527184 A        1/2014
(Continued)

OTHER PUBLICATIONS

English translation of CN110333551A, Oct. 2019. (Year: 2019).*

(Continued)

*Primary Examiner* — Michael P Nghiem
(74) *Attorney, Agent, or Firm* — WPAT, PC

(57) ABSTRACT

The invention discloses a dolomite reservoir prediction method and system based on well and seismic combination, and storage medium. The method steps include: obtaining the dolomite index characteristic curve through well log sensitivity analysis, and distinguishing the dolomite and limestone according to the difference in their response range; after the artificial intelligence deep learning is performed on the dolomite index characteristic curve of the drilling area, the dolomite index characteristic curve of the virtual drilling area is obtained; according to the dolomite index characteristic curve of the drilling area and the virtual drilling area, the post-stack seismic data is used for inversion to obtain the distribution and development status of the dolomite reservoir in the test area. The invention effectively distinguishes the dolomite and limestone through the dolomite index characteristic curve, and accurately predicts the distribution and development status of the dolomite reservoir in the test area with less wells.

8 Claims, 6 Drawing Sheets

(51) Int. Cl.
*G06F 30/27* (2020.01)
*E21B 47/14* (2006.01)
*G01V 1/36* (2006.01)

(52) U.S. Cl.
CPC ....... *G06N 20/00* (2019.01); *G01V 2210/514* (2013.01)

(58) Field of Classification Search
CPC ...... G01V 99/005; G06N 20/00; E21B 47/14; E21B 49/00; G06F 30/27
USPC .......................................................... 702/6
See application file for complete search history.

(56) References Cited

FOREIGN PATENT DOCUMENTS

| | | | |
|---|---|---|---|
| CN | 105005077 | A | 10/2015 |
| CN | 107402411 | A | 11/2017 |
| CN | 109425896 | A | 3/2019 |
| CN | 110333551 | A * | 10/2019 |

OTHER PUBLICATIONS

English translation of CN103527184A, Jan. 2014. (Year: 2014).*
English translation of Chai Zhi (CN 103527184A), Jan. 2014. (Year: 2014).*
Journal of Guangdong University of Petrochemical Technology, vol. 24, No. 1, Yong Gao, Practice of Logging Constrained Inversion in Prediction of Baiyun Shale Reservoir, pp. 72-75, Feb. 2014.

* cited by examiner

DOLOMITE RESERVOIR PREDICTION METHOD AND SYSTEM BASED ON WELL AND SEISMIC COMBINATION, AND STORAGE MEDIUM

FIELD OF THE DISCLOSURE

The disclosure relates to a dolomite reservoir prediction method, system and storage medium based on well seismic combination.

BACKGROUND

As one of the most important carbonate reservoirs, dolomite has been favored by explorers for many years. In recent years, the discovery of many large oil and gas fields in China is closely related to the status of dolomite reservoirs. Therefore, the exploration method of predicting the distribution of oil and gas fields through the distribution of dolomite reservoirs has attracted more and more attention. Because the vertical and lateral phase changes of dolomite reservoirs change rapidly, and the heterogeneity is strong, especially the difference between shear wave impedance and limestone is small, which makes it difficult to distinguish between the dolomite layer and the limestone layer on the seismic profile. At present, the geophysical predictions of dolomite reservoirs are mostly based on the pre-stack inversion technology under forward modeling. Although good prediction results have been achieved, they need to be combined with pre-stack seismic data for prediction calculations. In most areas, there is a lack of pre-stack seismic data, and the use of existing pre-stack inversion techniques to predict dolomite reservoirs in China has great limitations, so how to effectively use post-stack seismic data to predict the distribution characteristics of dolomite reservoirs is directly related to the next step of exploration and deployment. In particular, due to the difficulty of distinguishing dolomite and limestone in log data, it is more difficult to predict the dolomite in the less wells area. Therefore, the development of dolomite post-stack inversion technology is greatly restricted.

In response to this problem, a new dolomite reservoir prediction method is needed to solve the above problems.

SUMMARY

A technical problem to be solved by the disclosure is that the dolomite and limestone are difficult to distinguish on the shear wave impedance plot, and it is difficult to predict the dolomite reservoir by using post-stack inversion technology in the less wells area.

In first aspect, the present invention provides a dolomite reservoir prediction method based on well seismic combination, including the following steps:

Obtaining log data in the test area, and the test area includes a drilling area and a virtual drilling area;

Performing log sensitivity analysis on log data of known wells in the drilling area, obtaining the dolomite index characteristic curve of the drilling area, and distinguishing dolomite and limestone according to the difference in the response range of the dolomite index characteristic curve of the drilling area;

After the artificial intelligence deep learning is performed on the dolomite index characteristic curve of the drilling area, the dolomite index characteristic curve of the virtual drilling area is obtained;

According to the dolomite index characteristic curve of the drilling area and the virtual drilling area, the post-stack seismic data is used for inversion to obtain the distribution and development status of the dolomite reservoir in the test area.

The dolomite reservoir prediction system based on well seismic combination includes a detection module, a characteristic curve calculation module, an artificial intelligence learning module, and a post-stack inversion module, and the above four are in turn electrically connected, wherein:

The detection module is used to obtain the log data of the drilling area in the test area that includes the drilling area and the virtual drilling area, and pass it to the characteristic curve calculation module;

The characteristic curve calculation module is used to perform log sensitivity analysis on the log data of known wells in the drilling area, to obtain the dolomite index characteristic curve of the drilling area; distinguishing dolomite and limestone according to the difference in the response range of the dolomite index characteristic curve of the drilling area, and transmitting the distinguished dolomite log data of the drilling area and the dolomite index characteristic curve to the artificial intelligence learning module;

The artificial intelligence learning module is used to obtain the dolomite index characteristic curve of the virtual well in the virtual drilling area after the artificial intelligence deep learning of the dolomite index characteristic curve of the drilling area, and transmitting the dolomite index characteristic curves of the known well and virtual well to the post-stack inversion module;

The post-stack inversion module is used to invert the post-stack seismic data with the dolomite index characteristic curves of the drilling area and the virtual drilling area as constraints, to obtain the distribution and development status of the dolomite reservoir in the test area.

In second aspect, the present invention provides a dolomite reservoir prediction system based on well seismic combination performs the dolomite reservoir prediction method based on well seismic combination above.

In third aspect, the present invention provides a storage medium having stored program data, and the program data can be executed to perform the dolomite reservoir prediction method based on well seismic combination above.

The beneficial effect of the technical scheme proposed in the disclosure is: distinguishing the dolomite and limestone by the dolomite index characteristic curve, through artificial intelligence deep learning and post-stack seismic data, accurately predicting the distribution and development status of the dolomite reservoir in the test area, which provides an effective prediction method for the exploration work in the less wells area.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
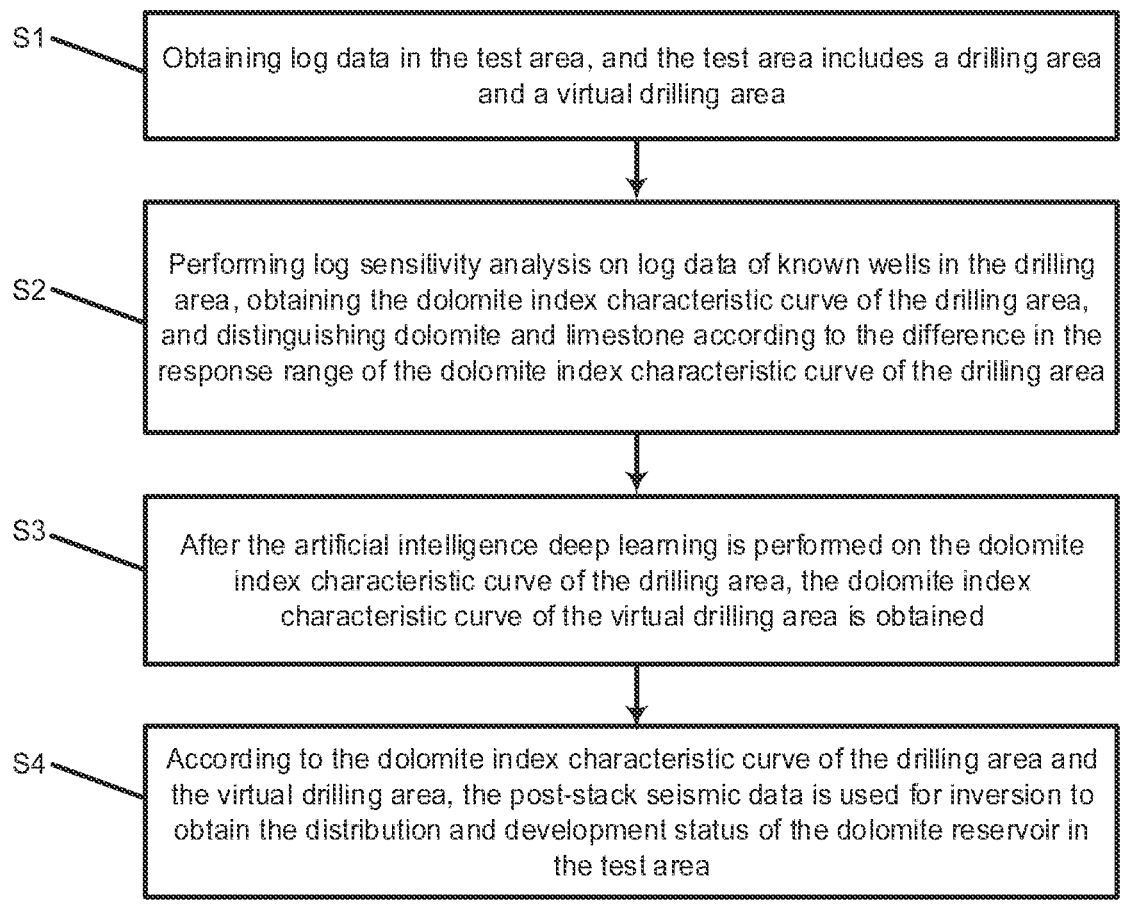
FIG. 1 is a flow chart of the dolomite reservoir prediction method based on well seismic combination.
Figure 2:
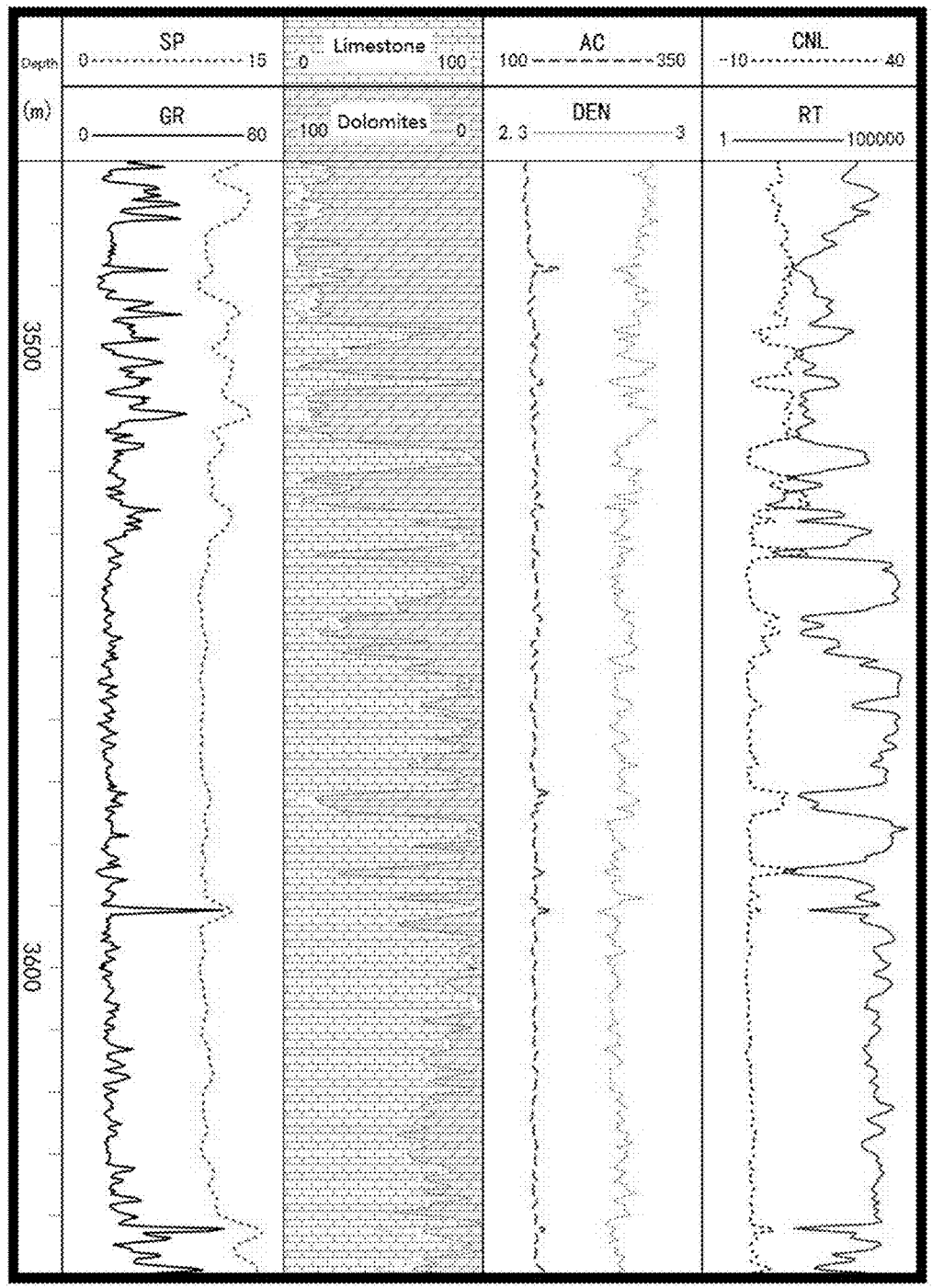
FIG. 2 is a comprehensive histogram of the known well in the dolomite reservoir prediction method based on well seismic combination.

For the first solution provided by the present invention, it is provided a dolomite reservoir prediction method based on well seismic combination. Please refer to FIG. 1, and FIG. 1 is a flow chart of the dolomite reservoir prediction method based on well seismic combination. The dolomite reservoir prediction method based on well seismic combination, including the following steps:

S1, obtaining log data in the test area, and the test area includes a drilling area and a virtual drilling area. In this step, the log data of the known wells in the drilling area in the test area includes acoustic time difference AC, density DEN, neutron CNL, and so on. As shown in FIG. 2, the acoustic time difference AC, density DEN and neutron CNL in these log data will be applied to the following dolomite index characteristic curve, which will play a role in distinguishing dolomite from limestone.

Figure 3:
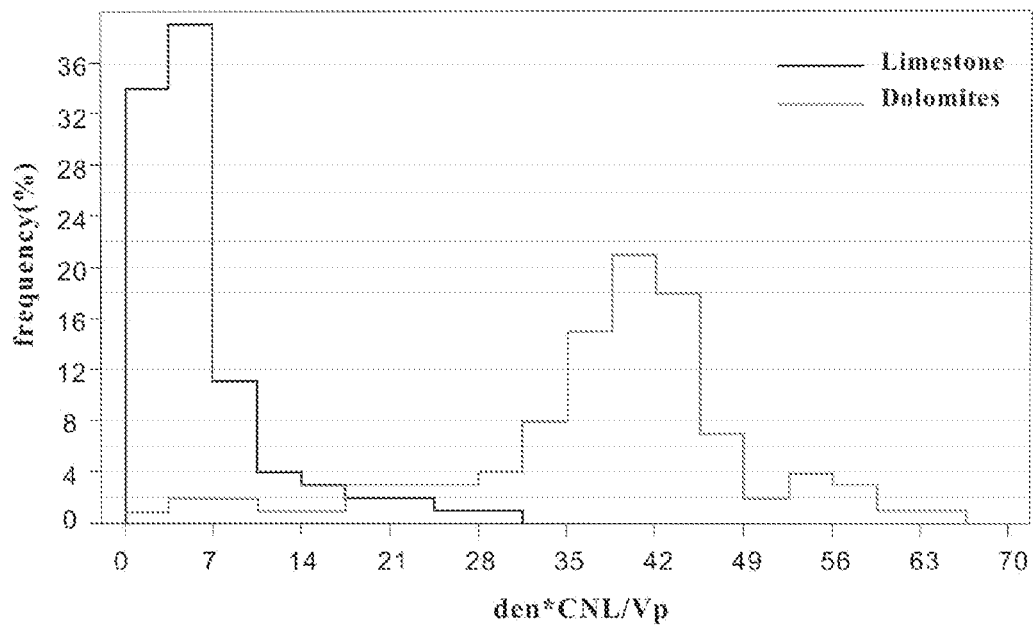
FIG. 3 is a histogram of probabilistic statistics based on characteristic curve of dolomite index.

S2, performing log sensitivity analysis on log data of known wells in the drilling area, obtaining the dolomite index characteristic curve of the drilling area, and distinguishing dolomite and limestone according to the difference in the response range of the dolomite index characteristic curve of the drilling area. In this step, the dolomite index characteristic curve of the known well in the drilling area is $I_{dolo}$: $I_{dolo}=DEN*CNL*AC10^{-6}$, wherein AC is the acoustic time difference, DEN is the density, and CNL is the neutron. It can be seen from the comprehensive histogram of the known well in FIG. 2 that on the shear wave impedance diagram, the waves of dolomite and limestone are difficult to distinguish. The log data of the known wells in the drilling area in step S1 is brought into the above dolomite index characteristic curve for probability statistics. For the different characteristic response ranges between dolomite and limestone, it is very easy to distinguish the two. As shown in FIG. 3, FIG. 3 is a histogram of probabilistic statistics based on characteristic curve of dolomite index, wherein the dark column line corresponds to the limestone data, and the light column line corresponds to the dolomite data. Taking the content of more than 3% as the characteristic response state of the rock layer, the difference in the response range of the dolomite and limestone is specifically: the difference in the response range of the dolomite index characteristic curve is specifically: the characteristic response range of dolomite to the dolomite index characteristic curve of the drilling area is 31.5~49, and the characteristic response range of limestone to the dolomite index characteristic curve of the drilling area is 0~14. The two have obvious differences in response range, which proves that the above dolomite index characteristic curve $I_{dolo}$ is beneficial to distinguish between dolomite and limestone, thus solving the problem of difficulty in distinguishing dolomite and limestone on the shear wave impedance diagram.

Figure 4:
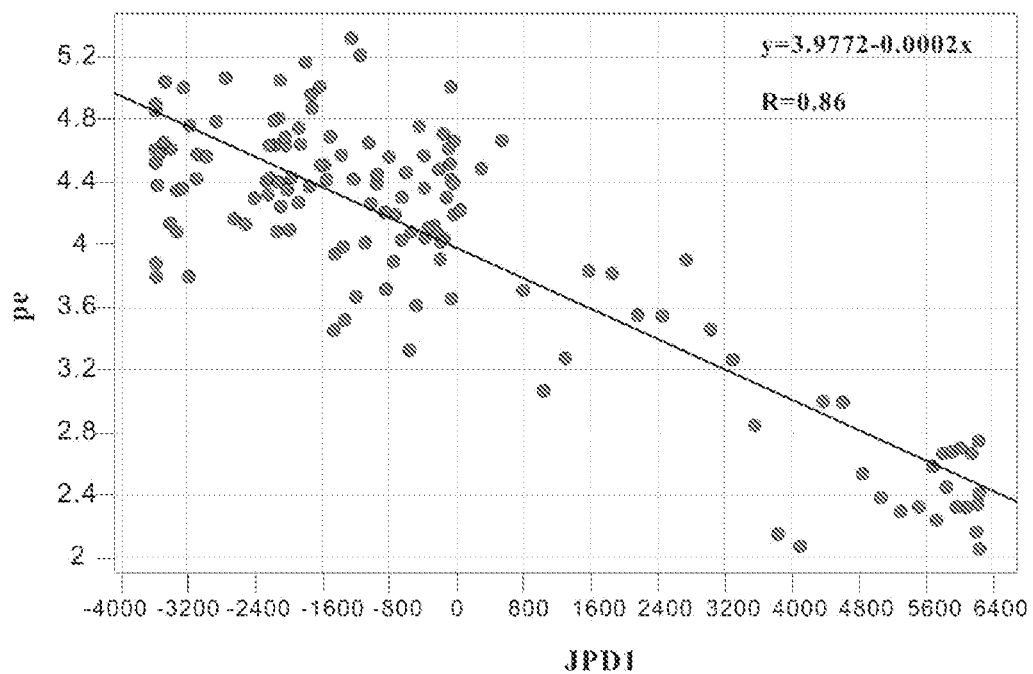
FIG. 4 is an intersection analysis diagram of optical cross-sectional index and seismic well bypass curve.

S3, after the artificial intelligence deep learning is performed on the dolomite index characteristic curve of the drilling area, the dolomite index characteristic curve of the virtual drilling area is obtained. In this step, because there is only one well in the study area, known as the well L1 in the drilling area, and the prediction of dolomite reservoirs from only one known well will greatly reduce the accuracy of the reservoir prediction, so it needs to be set a virtual drilling area in the test area. The virtual drilling area contains several virtual wells, preferably 2 to 3 virtual wells are set. In this embodiment, 3 virtual wells are selected and named A, B and C respectively. According to the three-dimensional post-stack seismic data volume, the seismic well bypass curve JPD at three locations of the virtual well A, B and C can be obtained. As shown in FIG. 4, FIG. 4 is an intersection analysis diagram of the optical cross-sectional index and the seismic well bypass curve in an embodiment of the method for predicting dolomite reservoirs based on the combination of well and seismic. The FIG. 4 is based on the analysis of the data of the optical cross-sectional index Pe and the seismic well bypass curve JPD at the known drilling L1 in the drilling area. It can be seen that there is a linear correlation between the optical cross-sectional index pe and the seismic well bypass curve JPD at the known drilling L1 in the drilling area. Using this characteristic, the linear relationship between the optical cross-sectional index pe and the seismic well bypass curve JDP at the three locations of virtual well A, B, and C was established, and the optical cross-sectional index Pe of the virtual well was obtained. Based on the correlation between the dolomite index characteristic curve and the optical cross-sectional index Pe at the known well L1 in the drilling area, through artificial intelligence deep learning, the dolomite index characteristic curve in the virtual drilling area is obtained according to the optical cross-sectional index Pe of the virtual well. By setting the characteristic curve of the dolomite index at the known well L1 in the drilling area, and setting the constraints accordingly, the artificial intelligence deep learning software will automatically generate the dolomite index characteristic curve of the virtual well A, B, and C. In the process of artificial intelligence deep learning, corresponding intermediate parameters and the maximum, minimum, and correlation coefficients of these parameters are also automatically generated. These intermediate parameters are helpful for the tester to accurately grasp the calculation trend of each artificial intelligence deep learning, and also have a guiding role in the model establishment and correction of the post-stack inversion process in the subsequent step S4.

To explain the meaning of each curve in step S4, the main function of the dolomite index characteristic curve $I_{dolo}$ is to use the significant difference in the characteristic response range between dolomite and limestone to effectively distinguish between dolomite and limestone. The seismic well bypass curve JPD is a well bypass curve extracted from three-dimensional post-stack seismic data, and its role is to reflect the change of lithology. The optical cross-sectional index Pe mainly reflects the average atomic number Z of the rock, so as to better reflect the lithology and define a parameter proportional to the electron photoelectric absorption cross-section r/Z. In addition, there is a linear correlation between the optical cross-sectional index Pe and the seismic well bypass curve JPD, and by the bridge action of the optical cross-sectional index Pe, the dolomite index characteristic curves at the three locations of the virtual well A, B, and C are obtained. The role of the virtual well dolomite index characteristic curve is to distinguish the distribution of virtual well dolomite and limestone, so that it can be applied to the inversion prediction of the subsequent virtual drilling area.

Figure 5:
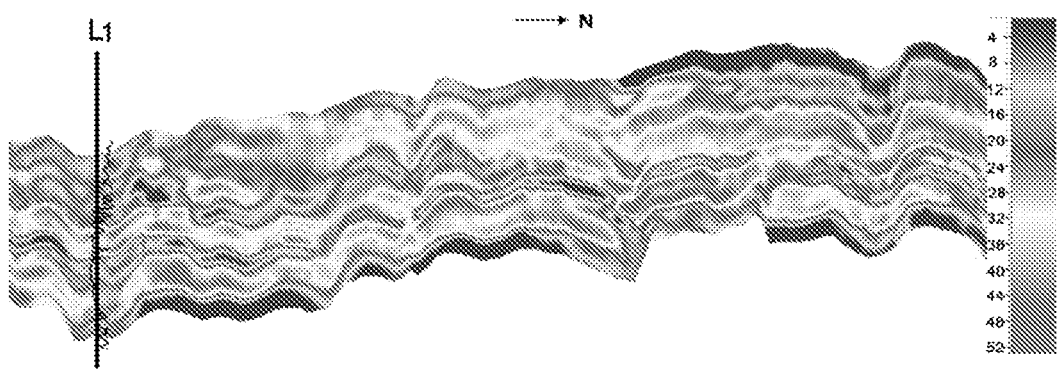
FIG. 5 is a profile of seismic waveform inversion in the drilling area.
Figure 6:
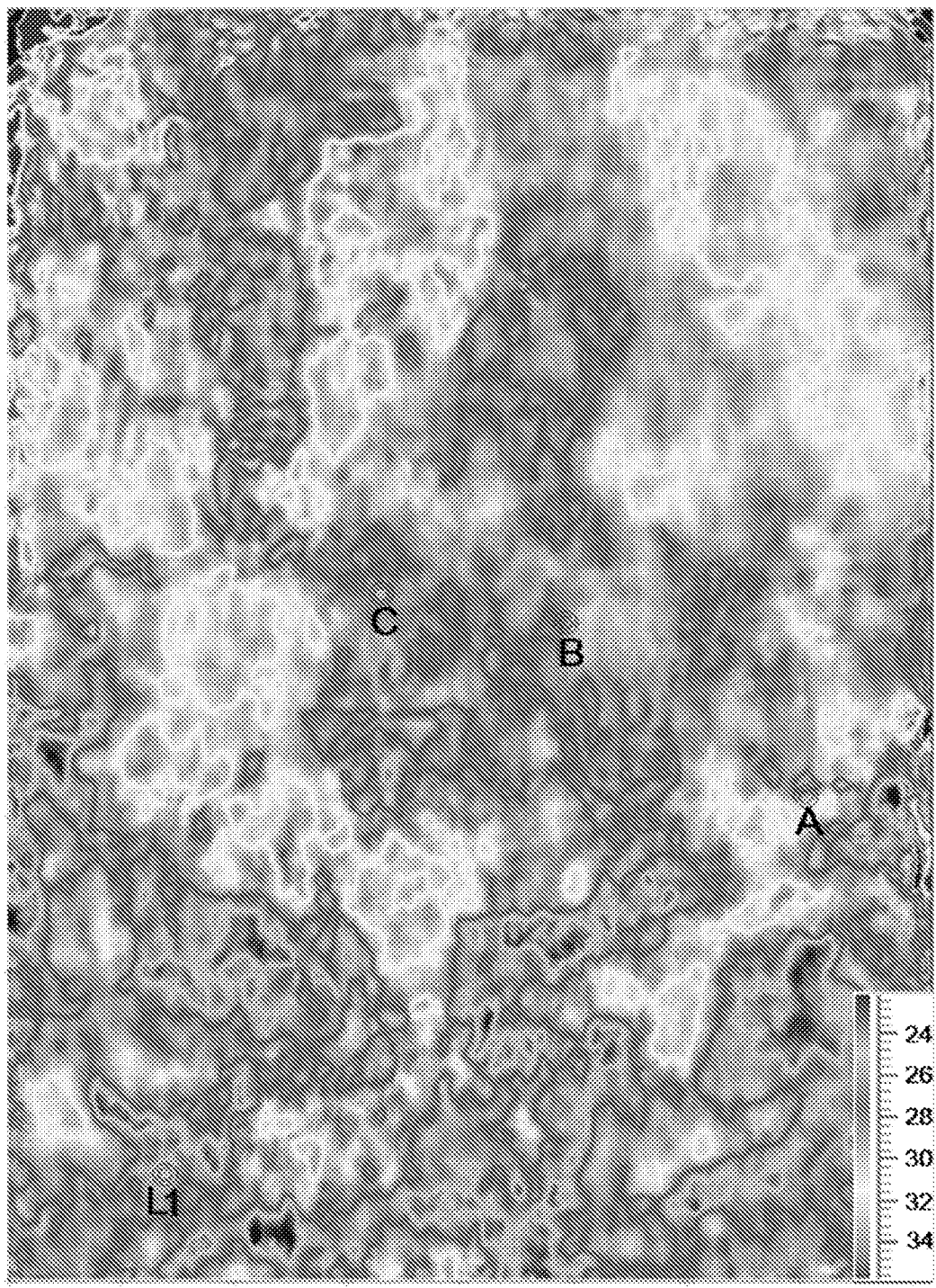
FIG. 6 is a prediction map of dolomite development in the virtual drilling area.

S4, according to the dolomite index characteristic curve of the drilling area and the virtual drilling area, the post-stack seismic data is used for inversion to obtain the distribution and development status of the dolomite reservoir in the test area. In this step, the dolomite index characteristic curves at the three positions A, B, and C of the virtual well obtained in step S3 and the dolomite index characteristic curve of the known well L1 are used as constraints, and selecting appropriate sample data including sample parameters and high frequency components, and establishing the corresponding initial model. Among them, the sample data is taken from the number of wells, specifically including the number of virtual wells, and the initial model is the seismic inversion participation model. The selected sample data is substituted into the initial model, and the seismic waveform difference inversion is used to predict the distribution and development of the dolomite reservoir on the seismic profile of the well, and the inversion results are obtained. Please refer to FIG. 5 and FIG. 6, FIG. 5 is a profile of seismic waveform inversion in the drilling area, and FIG. 6 is a prediction map of dolomite development in the virtual drilling area. Comparing the inversion results with the distribution and development of the dolomite reservoir in the drilling area, and correcting the inversion results until they are basically consistent with the distribution and development of the dolomite reservoir in the drilling area. And then the distribution and development of the dolomite reservoir in the test area are obtained. Specifically, the specific steps of correcting the inversion results are: when the inversion result and the distribution and development status of the dolomite reservoir in the drilling area are low, the correction sample data is reselected and the corresponding correction model is re-established; substituting the corrected sample data into the corrected model, and using seismic waveform difference inversion to predict the distribution and development status of the dolomite reservoir on the seismic profile of the well, to obtain inversion correction results; comparing the inversion correction results with the distribution and development status of the dolomite reservoir in the drilling area, when the inversion correction results and the distribution and development status of the dolomite reservoir in the drilling area are low , and then repeating the above correction steps, otherwise terminating the above correction steps and obtaining the distribution and development status of the dolomite reservoir in the test area.

In this embodiment, the creation of the initial model and the correction model and the calculation process are performed by the public seismic inversion software, that is, the calculation method and programming of the seismic inversion software are well-known contents, here do not elaborate. FIG. 5 is an inversion profile of the dolomite reservoir of the known well L1 in the north-south drilling area. Comparing the distribution and development of the dolomite reservoirs in FIG. 5 and FIG. 6, it can be seen that the distribution content of the development degree of the dolomite in the test area obtained by inversion is basically consistent with the results of the known well L1. It shows that the combination of the above dolomite index characteristic curve and the inversion of seismic waveform differences can accurately predict the spatial distribution and development of the dolomite reservoir in the test area. That is, by obtaining the properties of the target stratum, the distribution characteristics and development degree of the target stratum dolomite in the plane can be obtained. Further, the seismic inversion data volume of the dolomite reservoir development degree obtained by the above method can also be used by seismic waveform difference inversion technology to further improve the data inversion accuracy and calibration accuracy, so as to more accurately predict the distribution and development of dolomite reservoirs in the test area. This method provides a more effective and accurate method for dolomite reservoir prediction in research areas with less wells.

Figure 7:
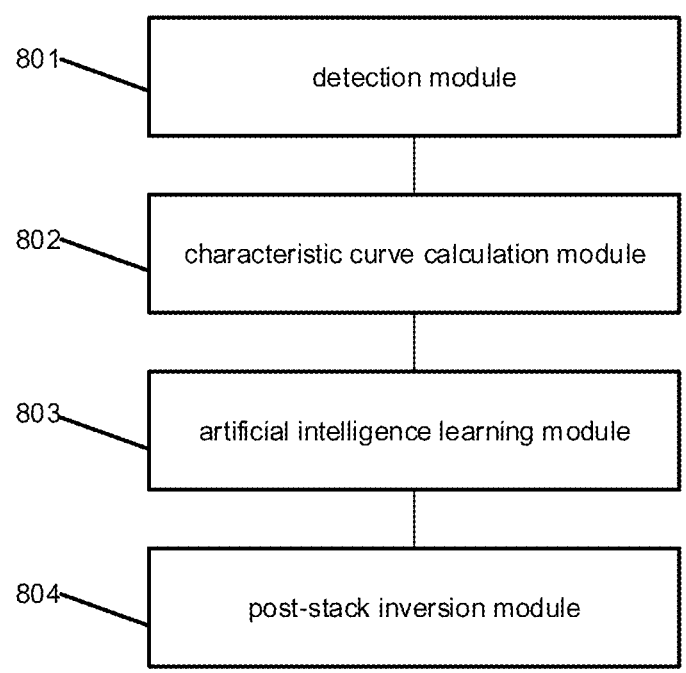
FIG. 7 is a structural diagram of the dolomite reservoir prediction system based on well seismic combination.

For the second solution provided by the present invention, it is provided a dolomite reservoir prediction system based on well seismic combination. Please refer to FIG. 7, FIG. 7 is a structural diagram of the dolomite reservoir prediction system based on well seismic combination. The dolomite reservoir prediction system based on well seismic combination includes a detection module 801, a characteristic curve calculation module 802, an artificial intelligence learning module 803, and a post-stack inversion module 804, and the above four are in turn electrically connected, wherein: the detection module 801 is used to obtain the log data of the drilling area in the test area that includes the drilling area and the virtual drilling area, and pass it to the characteristic curve calculation module 802; the characteristic curve calculation module 802 is used to perform log sensitivity analysis on the log data of known wells in the drilling area, to obtain the dolomite index characteristic curve of the drilling area; distinguishing dolomite and limestone according to the difference in the response range of the dolomite index characteristic curve of the drilling area, and transmitting the distinguished dolomite log data of the drilling area and the dolomite index characteristic curve to the artificial intelligence learning module 803; the artificial intelligence learning module 803 is used to obtain the dolomite index characteristic curve of the virtual well in the virtual drilling area after the artificial intelligence deep learning of the dolomite index characteristic curve of the drilling area, and transmitting the dolomite index characteristic curves of the known well and virtual well to the post-stack inversion module 804; the post-stack inversion module 804 is used to invert the post-stack seismic data with the dolomite index characteristic curves of the drilling area and the virtual drilling area as constraints, to obtain the distribution and development status of the dolomite reservoir in the test area. The dolomite reservoir prediction system based on well-seismic combination performs the above dolomite reservoir prediction method based on well seismic combination. The prediction method has been described in detail above, and will not be repeated here.

It should be pointed out that those technicians in the field should know that each module and execution step in the second solution can be implemented by a logic operation device such as a computer. These modules and execution steps can be centralized on a single computing device or distributed on a common network composed of multiple computing devices. They can also be made into individual integrated circuit modules, or multiple modules or steps among them can be made into a single integrated circuit module. That is, the second solution in the present invention is not limited to any specific combination of hardware and software.

For the third solution provided by the present invention, it is provided a storage medium. Program data is stored in the storage medium, and the program data can be executed to implement any of the first solution based on the dolomite reservoir prediction method based on well seismic combination. In the present invention, the storage medium is used to store program data related to the aforementioned dolomite reservoir prediction method based on well-seismic combination, and used to execute the aforementioned dolomite reservoir prediction method based on well-seismic combination, and the storage medium may include: U Disks, removable hard disks, read-only memory (ROM), random-access memory (RAM), magnetic disks, or optical disks and other media that can store program codes are not limited herein.

In summary, distinguishing the dolomite and limestone by the dolomite index characteristic curve, through artificial intelligence deep learning and post-stack seismic data, accurately predicting the distribution and development status of the dolomite reservoir in the test area, which provides an effective prediction method for the exploration work in the less wells area.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A dolomite reservoir prediction method based on well seismic combination, including steps:
    obtaining log data in a test area, and the test area includes a drilling area and a virtual drilling area;
    performing log sensitivity analysis on log data of known wells in the drilling area, obtaining a dolomite index characteristic curve of the drilling area, and distinguishing dolomite and limestone according to a difference in a response range of the dolomite index characteristic curve of the drilling area;
    after an artificial intelligence deep learning is performed on the dolomite index characteristic curve of the drilling area, a dolomite index characteristic curve of the virtual drilling area is obtained;
    according to the dolomite index characteristic curve of the drilling area and the dolomite index characteristic curve of the virtual drilling area, post-stack seismic data is used for inversion to obtain a distribution and development status of a dolomite reservoir in the test area;
    specific steps that the dolomite index characteristic curve of the virtual drilling area is obtained after the artificial intelligence deep learning is performed on the dolomite index characteristic curve of the drilling area are:
    setting the virtual drilling area in the test area, and the virtual drilling area includes several virtual wells, and a seismic well bypass curve of each virtual drilling is obtained according to a three-dimensional post-stack seismic data volume;
    based on characteristics of a linear correlation between an optical cross-sectional index at the drilling area and a seismic well bypass curve, a linear relationship between an optical cross-sectional index of the virtual well and the seismic well bypass curve is established, and the optical cross-sectional index of the virtual well is obtained;
    based on the correlation between the dolomite index characteristic curve of the drilling area and the optical cross-sectional index, through the artificial intelligence deep learning, a dolomite index characteristic curve of the virtual well is obtained according to an optical cross-sectional index of the virtual drilling.

2. The dolomite reservoir prediction method based on well seismic combination according to claim 1, wherein log data of the known wells in the drilling area includes acoustic time difference AC, density DEN and neutron CNL of the dolomite.

3. The dolomite reservoir prediction method based on well seismic combination according to claim 2, wherein a dolomite index characteristic curve of the known wells in the drilling area is Idolo: Idolo=DEN*CNL*AC*10**6.

4. The dolomite reservoir prediction method based on well seismic combination according to claim 3, wherein the difference in the response range of the dolomite index characteristic curve of the drilling area is specifically: a characteristic response range of the dolomite to the dolomite index characteristic curve of the drilling area is 31.5~49, and a characteristic response range of the limestone to the dolomite index characteristic curve of the drilling area is 0-14.

5. The dolomite reservoir prediction method based on well seismic combination according to claim 1, wherein the dolomite index characteristic curve of the virtual well is used to distinguish a distribution state of dolomite and limestone in the virtual well.

6. The dolomite reservoir prediction method based on well seismic combination according to claim 1, wherein specific steps that the post-stack seismic data is used for inversion to obtain the distribution and development status of the dolomite reservoir in the test area, according to the dolomite index characteristic curve of the drilling area and the dolomite index characteristic curve of the virtual drilling area are:
    according to the dolomite index characteristic curve of the known wells in the drilling area and the virtual well in the virtual drilling area, selecting sample data and establishing a corresponding initial model, where the sample data is taken from a number of the virtual well, the initial model is a seismic inversion participation model;
    substituting the sample data into the initial model, and using seismic waveform difference inversion to predict a distribution and development status of the dolomite reservoir on a seismic profile of a well, to obtain inversion results;
    comparing the inversion results with a distribution and development status of the dolomite reservoir in the drilling area, and correcting the inversion results until the inversion results is basically same as the distribution and development status of the dolomite reservoir in the drilling area, and then obtaining the distribution and development status of the dolomite reservoir in the test area.

7. The dolomite reservoir prediction method based on well seismic combination according to claim 6, wherein specific steps of correcting the inversion results are:
    when the inversion results and the distribution and development status of the dolomite reservoir in the drilling area are low, reelecting correction sample and re-establishing a corresponding correction model;
    substituting the corrected sample data into the corresponding correction model, and using seismic waveform difference inversion to predict the distribution and development status of the dolomite reservoir on the seismic profile of the well, to obtain inversion correction results;
    comparing the inversion correction results with the distribution and development status of the dolomite reservoir in the drilling area, when the inversion correction results and the distribution and development status of the dolomite reservoir in the drilling area are low, and then repeating the specific steps of correcting the inversion results, otherwise terminating the specific steps of correcting the inversion results.

8. A non-transitory storage medium having stored program data, and the program data can be executed to perform the dolomite reservoir prediction method based on well seismic combination according to claim 1.

* * * * *